(12) United States Patent
Takanuki et al.

(10) Patent No.: US 7,026,823 B2
(45) Date of Patent: Apr. 11, 2006

(54) MAGNETIC HEAD SMEAR DETECTING METHOD AND DEVICE

(75) Inventors: Kazuaki Takanuki, Tokyo (JP); Masaaki Kaneko, Tokyo (JP); Osamu Harakawa, Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 10/852,235

(22) Filed: May 25, 2004

(65) Prior Publication Data

US 2004/0239343 A1 Dec. 2, 2004

(30) Foreign Application Priority Data

May 29, 2003 (JP) ............................. 2003-153388

(51) Int. Cl.
*G01R 31/08* (2006.01)
(52) U.S. Cl. ...................................... 324/525; 324/754
(58) Field of Classification Search ................ 324/510, 324/696, 525, 210–212, 723, 754–765
See application file for complete search history.

(56) References Cited

U.S. PATENT DOCUMENTS

| | | | |
|---|---|---|---|
| 5,644,245 A | * | 7/1997 | Saitoh et al. ................ 324/754 |
| 5,821,746 A | * | 10/1998 | Shelor ......................... 324/210 |
| 6,731,464 B1 | * | 5/2004 | Sasaki et al. ............. 360/236.3 |
| 6,851,096 B1 | * | 2/2005 | Alexander ...................... 716/4 |
| 6,861,845 B1 | * | 3/2005 | Taylor et al. ................ 324/512 |

FOREIGN PATENT DOCUMENTS

| | | |
|---|---|---|
| JP | 3-272329 | 12/1991 |
| JP | 2000-182219 | 6/2000 |
| JP | 2000-242917 | 9/2000 |
| JP | 2000-322712 | 11/2000 |
| JP | 2002-74614 | 3/2002 |
| JP | 2002-197608 | 7/2002 |

\* cited by examiner

*Primary Examiner*—Anjan Deb
*Assistant Examiner*—John Zhu
(74) *Attorney, Agent, or Firm*—Oblon, Spivak, McClelland, Maier & Neustadt, P.C.

(57) ABSTRACT

To provide a method of, and a device for, detecting smear of a magnetic head, in which detection of smear development before magnetic head assembly is made possible by measuring electrical resistance values between pads and shields of a slider that is integrated with a head main body portion, and in addition, throughput increases. The method of detecting smear of a magnetic head includes measuring electrical resistance values between pads of a slider having an integrated head main body portion, or between the pads and a conductor portion that is connected to a shield of the head main body portion to thereby detect smear development.

10 Claims, 12 Drawing Sheets

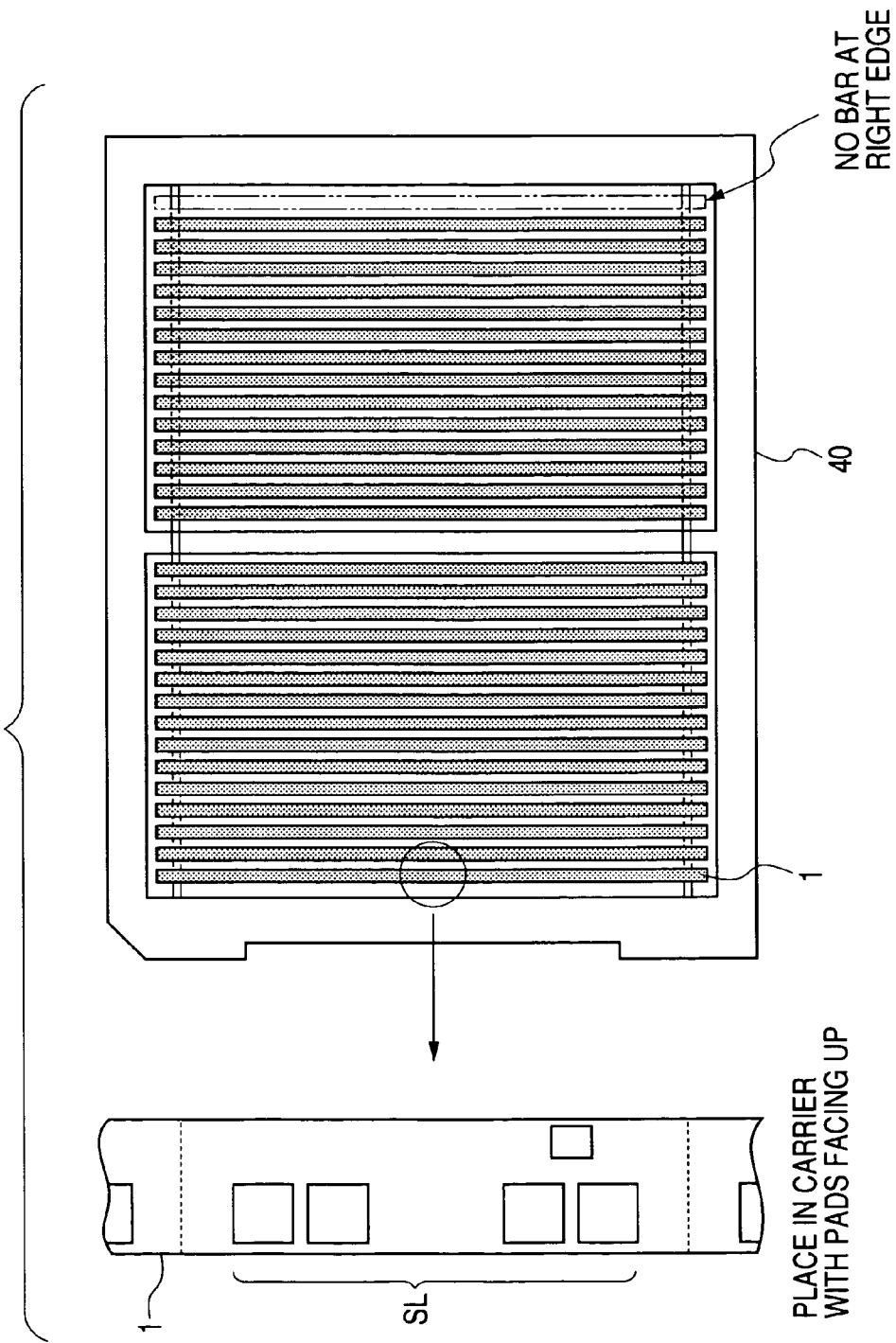

FIVE-PAD SLIDER

FOUR-PAD SLIDER

DIFFERENCE BETWEEN A-CHANNEL
TYPE AND B-CHANNEL TYPE

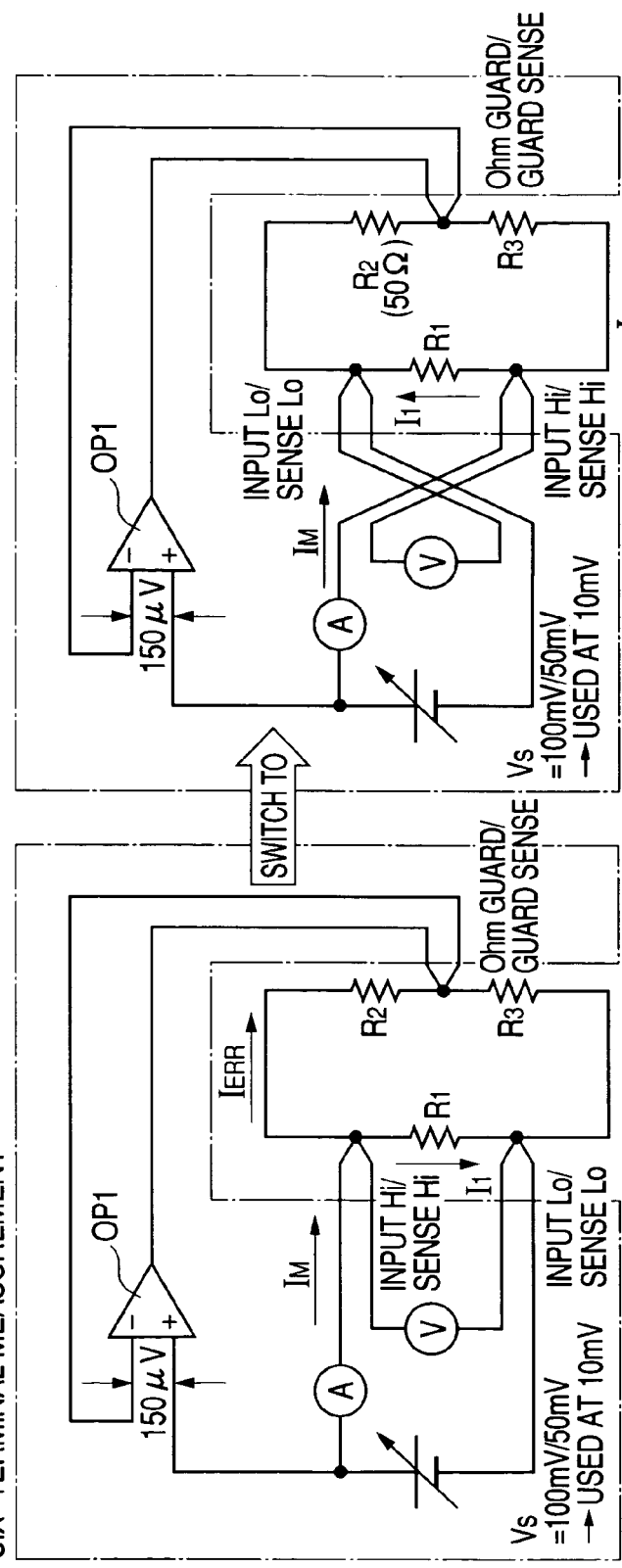

FIG. 8A

FOUR-TERMINAL MEASUREMENT
[FOUR-PAD EXAMPLE]

| | R1 (R1) Ω | R2 (R2) Ω | R3 (R3) Ω |
|---|---|---|---|
| SCAN 1 | 50 | 1200 | 1200 |
| SCAN 2 | 1200 | 50 | 1200 |
| SCAN 3 | 1200 | 1200 | 50 |

| MEASUREMENT ERROR OF Σ(R1−R3)R1 Ω | | |
|---|---|---|
| 49.0 | 2.04% | |
| 612.2 | 48.98% | NOT GOOD |
| 612.2 | 48.98% | NOT GOOD |

FIG. 8B

[FIVE-PAD EXAMPLE]

| | R1 (R1) Ω | R2 (R2) Ω | R3 (R3) Ω |
|---|---|---|---|
| SCAN 1 | 50 | 1200 | 1200 |
| SCAN 2 | 350000 | 50 | 350000 |
| SCAN 3 | 350000 | 350000 | 50 |

| MEASUREMENT ERROR OF Σ(R1−R3)R1 Ω | | |
|---|---|---|
| 50.0 | 0.01% | |
| 175012.5 | 50.00% | NOT GOOD |
| 175012.5 | 50.00% | NOT GOOD |

FIG. 8C

SIX-TERMINAL MEASUREMENT
[FOUR-PAD EXAMPLE]
COMBINATION OF 50Ω AND 1.2kΩ (WHEN Vs=10mV)

| | R1 (R1) Ω | R2 (R2) Ω | R3 (R3) Ω | Vs V | I1 A | Ierr A | Im=I1+Ierr A | Ierr/I1 | Rm=Vs/Im Ω | (R1−Rm)/R1 (R1 MEASUREMENT ERROR) |
|---|---|---|---|---|---|---|---|---|---|---|
| SCAN 1 | 50 | 1200 | 1200 | 0.01 | 2.00E-04 | 1.25E-07 | 2.00E-04 | 6.250E-04 | 49.97 | 0.06% |
| SCAN 2 | 1200 | 50 | 1200 | 0.01 | 8.33E-06 | 3.00E-06 | 1.13E-05 | 3.600E-01 | 882.35 | 26.47% |
| SCAN 3 | 1200 | 1200 | 50 | 0.01 | 8.33E-06 | 1.25E-07 | 8.46E-06 | 1.500E-02 | 1182.27 | 1.48% |

[FIVE-PAD EXAMPLE]
COMBINATION OF 50Ω AND INFINITE RESISTANCE (350kΩ) (WHEN $V_s$=10mV)

| | $R_1$ ($R_1$)Ω | $R_2$ ($R_2$)Ω | $R_3$ ($R_3$)Ω | $V_s$ V | $I_1$ A | $I_{ERR}$ A | $I_m = I_1 + I_{ERR}$ A | $I_{ERR}/I_1$ | $R_m = V_s/I_m$ Ω | $(R_1-R_m)/R_1$ ($R_1$ MEASUREMENT ERROR) |
|---|---|---|---|---|---|---|---|---|---|---|
| SCAN 1 | 50 | 350000 | 350000 | 0.01 | 2.00E-04 | 4.29E-10 | 2.00E-04 | 2.143E-06 | 50.00 | 0.00% |
| SCAN 2 | 350000 | 50 | 350000 | 0.01 | 2.86E-08 | 3.00E-06 | 3.03E-06 | 1.050E+02 | 3301.89 | 99.06% |
| SCAN 3 | 350000 | 350000 | 50 | 0.01 | 2.86E-08 | 4.29E-10 | 2.90E-08 | 1.500E-02 | 344827.59 | 1.48% |

FIG. 8E

SIX-TERMINAL MEASUREMENT
SWITCH INPUT HIGH/LOW ON SCAN 2 (WHEN $R_2$ IS 50Ω)

[FOUR-PAD EXAMPLE]
COMBINATION OF 50Ω AND 1.2kΩ (WHEN $V_s$=10mV, INPUT HIGH/LOW IS SWITCHED)

| | $R_1$ ($R_1$)Ω | $R_2$ ($R_2$)Ω | $R_3$ ($R_3$)Ω | $V_s$ V | $I_1$ A | $I_{ERR}$ A | $I_m = I_1 + I_{ERR}$ A | $I_{ERR}/I_1$ | $R_m = V_s/I_m$ Ω | $(R_1-R_m)/R_1$ ($R_1$ MEASUREMENT ERROR) |
|---|---|---|---|---|---|---|---|---|---|---|
| SCAN 1 | 50 | 1200 | 1200 | 0.01 | 2.00E-04 | 1.25E-07 | 2.00E-04 | 6.250E-04 | 49.97 | 0.06% |
| SCAN 2 | 1200 | 50 | 1200 | 0.01 | 8.33E-06 | 1.25E-07 | 8.46E-06 | 1.500E-02 | 1182.27 | 1.48% |
| SCAN 3 | 1200 | 1200 | 50 | 0.01 | 8.33E-06 | 1.25E-07 | 8.46E-06 | 1.500E-02 | 1182.27 | 1.48% |

FIG. 8F

FROM FIG. 8D

[FIVE-PAD EXAMPLE]
COMBINATION OF 50Ω AND INFINITE RESISTANCE (350kΩ) (WHEN Vs=10mV, INPUT HIGH/LOW IS SWITCHED)

| | $R_1$ $(R_1)$ Ω | $R_2$ $(R_2)$ Ω | $R_3$ $(R_3)$ Ω | Vs V | $I_1$ A | $I_{ERR}$ A | $I_M=I_1+I_{ERR}$ A | $I_{ERR}/I_1$ | $R_M=V_S/I_M$ Ω | $(R_1-R_M)/R_1$ ($R_1$ MEASUREMENT ERROR) |
|---|---|---|---|---|---|---|---|---|---|---|
| SCAN 1 | 50 | 350000 | 350000 | 0.01 | 2.00E-04 | 4.29E-10 | 2.00E-04 | 2.143E-06 | 50.00 | 0.00% |
| SCAN 2 | 350000 | 50 | 350000 | 0.01 | 2.86E-08 | 4.29E-10 | 2.90E-08 | 1.500E-02 | 34482759 | 1.48% |
| SCAN 3 | 350000 | 350000 | 50 | 0.01 | 2.86E-08 | 4.29E-10 | 2.90E-08 | 1.500E-02 | 34482759 | 1.48% |

* E-X MEANS $10^{-X}$ 
* NORMALLY $I_{ERR}$ IS CURRENT FLOWING IN $R_2$ DURING SCAN 1 AND SCAN 3, BUT $I_{ERR}$ IS CURRENT FLOWING IN $R_3$ DURING SCAN 2 WITH INPUT HIGH/LOW SWITCHED $R_i$: RESISTANCE VALUE TO BE MEASURED
$V_S$: VOLTAGE APPLIED TO RESISTOR $R_1$
$I_i$: VALUE OF CURRENT FLOWING IN $R_1$
$I_{ERR}$: VALUE OF CURRENT FLOWING BETWEEN HI AND GUARD
$I_M$: VALUE OF CURRENT MEASURED BY MEASUREMENT UNIT
$R_M$: RESISTANCE VALUE DISPLAYED AS MEASUREMENT RESULT BY MEASUREMENT UNIT

MAGNETIC HEAD SMEAR DETECTING METHOD AND DEVICE

BACKGROUND OF THE INVENTION

1. Field of the Invention

The present invention relates to detecting smear as a cause of slider failures in a process of manufacturing a magnetic head (such as an HDD thin film magnetic head). In particular, the present invention relates to a method of, and a device for, detecting smear of a magnetic head capable of detecting the existence of smear in a state where a slider having an integrated head main body portion is in a bar shape before being cut into individual pieces.

2. Related Background Art

One example of a slider (an example of a five-pad slider) that configures this type of HDD thin film magnetic head is shown in FIGS. 9A and 9B, and another example (an example of a four-pad slider) is shown in FIGS. 10A and 10B. FIG. 9A and FIG. 10A show stages where a slider SL with an integrated head main body portion 10 has a bar shape before being sectioned into individual pieces. This shape is called a slider bar 1 here for convenience.

FIG. 9A is a schematic diagram of a five-pad slider having five pads (conductor surfaces), and FIG. 9B is a model diagram that shows an expanded view of the head main body portion 10. Each of the sliders SL has an insulator portion 22 bonded to (integrated with) a conductor portion 21 (for example, AlTiC: $Al_2O_3$—TiC), and bottom surfaces of the sliders form ABS surfaces (head surfaces). The head main body portion 10 of FIG. 9B is provided in the insulator portion 22 so as to be exposed in the ABS surface. That is, inductives (writing head portions) 11 and an MR element (reading head portion) used as a magnetic sensing element are embedded in the head main body portion 10 so as to be exposed in the ABS surface. Periphery portions of the MR element 12, and of electrodes 13a and 13b that are provided to both ends of the MR element 12 are surrounded by the insulator portion 22, and are sandwiched by shields 14a and 14b.

Five pads, an R+ pad, an R− pad, an S pad, a W+ pad, and a W− pad, are provided to a rear surface of the slider SL that is perpendicular to the ABS surface with the five-pad slider of FIG. 9A. One electrode of the MR element 12, the electrode 13a, is connected to the R+ pad of the rear surface of the slider that is perpendicular to the ABS surface, and the other electrode, the electrode 13b, is connected to the R− pad of the rear surface of the slider. Further, the shields 14a and 14b are connected to the S pad. The inductives 11 are connected to the W+ pad and the W− pad.

Furthermore, four pads, the R+ pad, the R− pad, the W+ pad, and the W− pad, are provided to a rear surface of the slider SL that is perpendicular to the ABS surface with the four-pad slider of FIG. 10A. The S pad is not provided. The shields 14a and 14b are therefore connected to the conductor portion 21, which is made from AlTiC or the like. Other structures are similar to those of FIG. 9A. Identical reference numerals are appended to identical or corresponding portions, and explanations of those portions are omitted.

Wear (smear) may develop in the shield portions, and short circuits or insulation failures may occur between the shields 14a and 14b and the electrodes 13a and 13b when polishing the ABS surfaces (head surfaces) in the slider bar 1 state during a process for manufacturing HDD thin film magnetic heads (FIG. 9B shows smear schematically). Failures of characteristics such as an increase in the amount of noise in the magnetic head occur owing to smear, and sliders that develop smear are not used. That is, the sliders become defective parts.

Standard resistance values and resistance values after smear has developed are shown in Table 1 below for the five-pad slider and the four-pad slider. Resistance values among the R+ pad, the R− pad, and the S pad, or among the R+ pad, the R− pad, and the conductor portion 21 are shown.

TABLE 1

| Standard resistance values Five-pad slider | | |
|---|---|---|
| Between R+ pad and S pad | Between R− pad and S pad | Between R+ pad and R pad |
| Smear not present ∞ | ∞ | 50 Ω |
| Smear present 1 kΩ or less | 1 kΩ or less | 50 Ω |
| Four-pad slider | | |
| Between R+ pad and conductor portion | Between R+ pad and conductor portion | Between R+ pad and R pad |
| Smear not present 1.25 kΩ | 1.25 kΩ | 50 Ω |
| Smear present 1 kΩ or less | 1 kΩ or less | 50 Ω |

Among known techniques relating to conventional HDD thin film magnetic heads, those disclosed in JP 2000-182219 A and JP 3272329 B make reference to smear. However, both techniques relate to head structures in which smear hardly develops, and neither techniques relates to a method of detecting smear.

SUMMARY OF THE INVENTION

As described above, smear detection has not been performed conventionally during manufacturing processes. Failures due to smear have therefore been unknown until manufactured products have been completed and checked for characteristics. Accordingly, it has been unable to exclude defective parts during processing, and excess costs have been incurred owing to the disposal of defective assembly parts and the like.

In view of the points described above, a first object of this present invention is to provide a method of, and a device for, detecting smear of a magnetic head, in which detection of the development of smear before magnetic head assembly is made possible by measuring electrical resistance values between pads and shields of a slider that is integrated with a head main body portion, and in addition, throughput increases.

A second object of the present invention is to provide a method of, and a device for, detecting smear of a magnetic head, in which it is possible to efficiently detect development of the smear by measuring the electrical resistance values in a slider bar state where a slider extends in a bar shape.

Other objects and novel features of the present invention will become clear in the embodiments described hereinafter.

In order to achieve the above objects, according to one aspect of the invention, a method of detecting smear of a magnetic head includes: measuring electrical resistance values between pads of a slider having an integrated head main body portion, or between the pads and a conductor portion that is connected to a shield of the head main body portion to thereby detect smear development.

In further aspect of the method, the measuring of the electrical resistance values is performed in a slider bar state where a plurality of the sliders are connected.

In further aspect of the method, the measuring of the resistance values is performed at one time on one slider, or a plurality of sliders, in the slider bar by using a probe card having one group, or a plurality of groups, of probes that contact the pads.

In further aspect of the method, the measuring of the electrical resistance values is performed by using three of the probes that contact the pads as one group, in which an arrangement of the three probes is set so that, for a slider having five pads, the three probes contact three pads from among the five pads, and for a slider having four pads, two of the three probes contact two pads from among the four pads, and in which the probe arrangement is commonly used for the slider having five pads and for the slider having four pads.

In further aspect of the method, coordinate data for positions of each of the slider pads in the slider bar is stored with respect to a reference point, and the probes are made to contact the pads based on the coordinate data.

In further aspect of the method, the probes are controlled to have a zero electric potential and a zero current when the probes contact the pads, and when the probes are removed from the pads.

In further aspect of the method, for cases where the measuring of the electrical resistance values is performed at three points between pads that are connected to electrodes at both ends of a magnetic sensing element in the head main body portion and a pad that is connected to a shield, or between the pads that are connected to the electrodes and a conductor portion, a predetermined direct current voltage is applied to a measurement object resistance (R1) by a voltage source, an electric potential difference between one terminal of the measurement object resistance (R1) and a connection point of a first non-measurement resistance (R2) and a second non-measurement resistance (R3) is maintained at a very low value, and the polarity of the direct current voltage of the voltage source is switched so that a current (IERR) flowing outside the measurement object resistance (R1) becomes small.

According to another aspect of the invention, a device for detecting smear of a magnetic head includes:

a stage on which a slider bar having a plurality of sliders with integrated head main body portions is placed;

positioning means for determining positions of the slider bars; and a resistance measurement circuit for measuring electrical resistance values between pads of the slider, or between the pads and a conductor portion that is connected to a shield of the head main body portion.

In further aspect of the device, the device further includes a probe card having a plurality of probe groups that contact the pads, wherein measurement of the electrical resistance values is performed at one time on a plurality of sliders in the slider bar.

In further aspect of the device, the probe groups are configured to each have three probes, and the three probes are arranged so that, for a slider having five pads, the three probes contact three pads from among the five pads, and for a slider having four pads, two of the three probes contact two of the four pads.

In further aspect of the device, the stage has an electrically conductive member that contacts the conductor portion that is connected to the shield of the slider bar.

BRIEF DESCRIPTION OF THE DRAWINGS

FIG. 3 is a plan view that shows an arrangement of a slider bar with respect to a carrier, and the direction of the slider bar in an embodiment;

FIG. 7A is a circuit diagram of a six-terminal measurement circuit that measures resistance values of a resistance network like that of FIG. 6 with high accuracy;

FIG. 7B is a circuit diagram of a six-terminal measurement circuit that measures resistance values of a resistance network like that of FIG. 6 with high accuracy;

FIG. 8A is a table that shows four-pad error measurement for four-terminal measurement in an embodiment;

FIG. 8B is a table that shows five-pad error measurement for four-terminal measurement in an embodiment;

FIG. 8C is a table that shows four-pad error measurement for six-terminal measurement in an embodiment;

FIG. 8D is a table that shows five-pad error measurement for six-terminal measurement in an embodiment;

FIG. 8E is a table that shows four-pad error measurement for six-terminal measurement in an embodiment;

FIG. 8F is a table that shows five-pad error measurement for six-terminal measurement in an embodiment;

DETAILED DESCRIPTION OF THE PREFERRED EMBODIMENTS

Embodiments of a method of, and a device for, detecting smear of a magnetic head according to the present invention are explained hereinafter with reference to the drawings.

Figure 1:
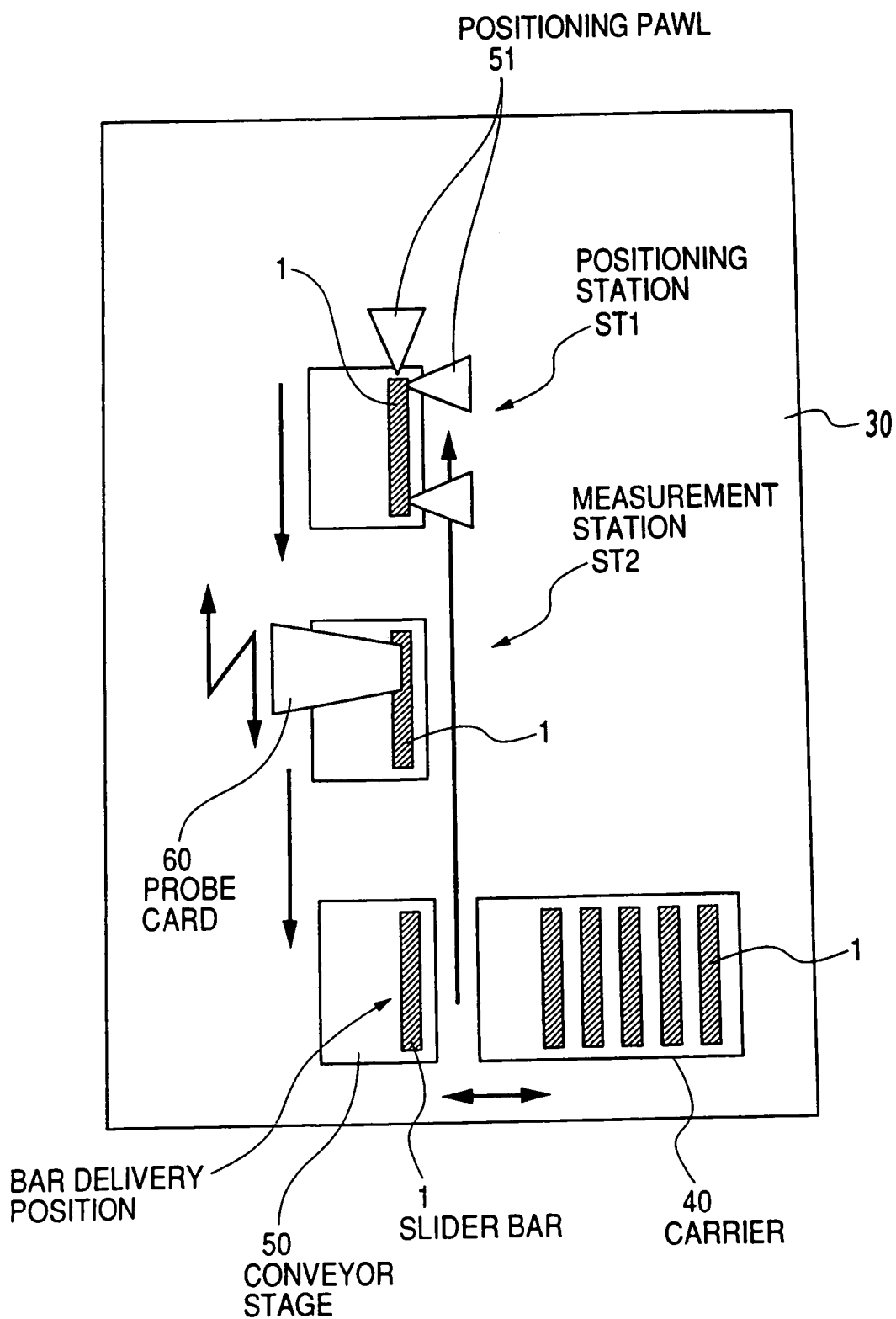
FIG. 1 is a schematic plan view that shows a device configuration of an embodiment of a method of, and a device for, detecting smear of a magnetic head according to the present invention.
Figure 2:
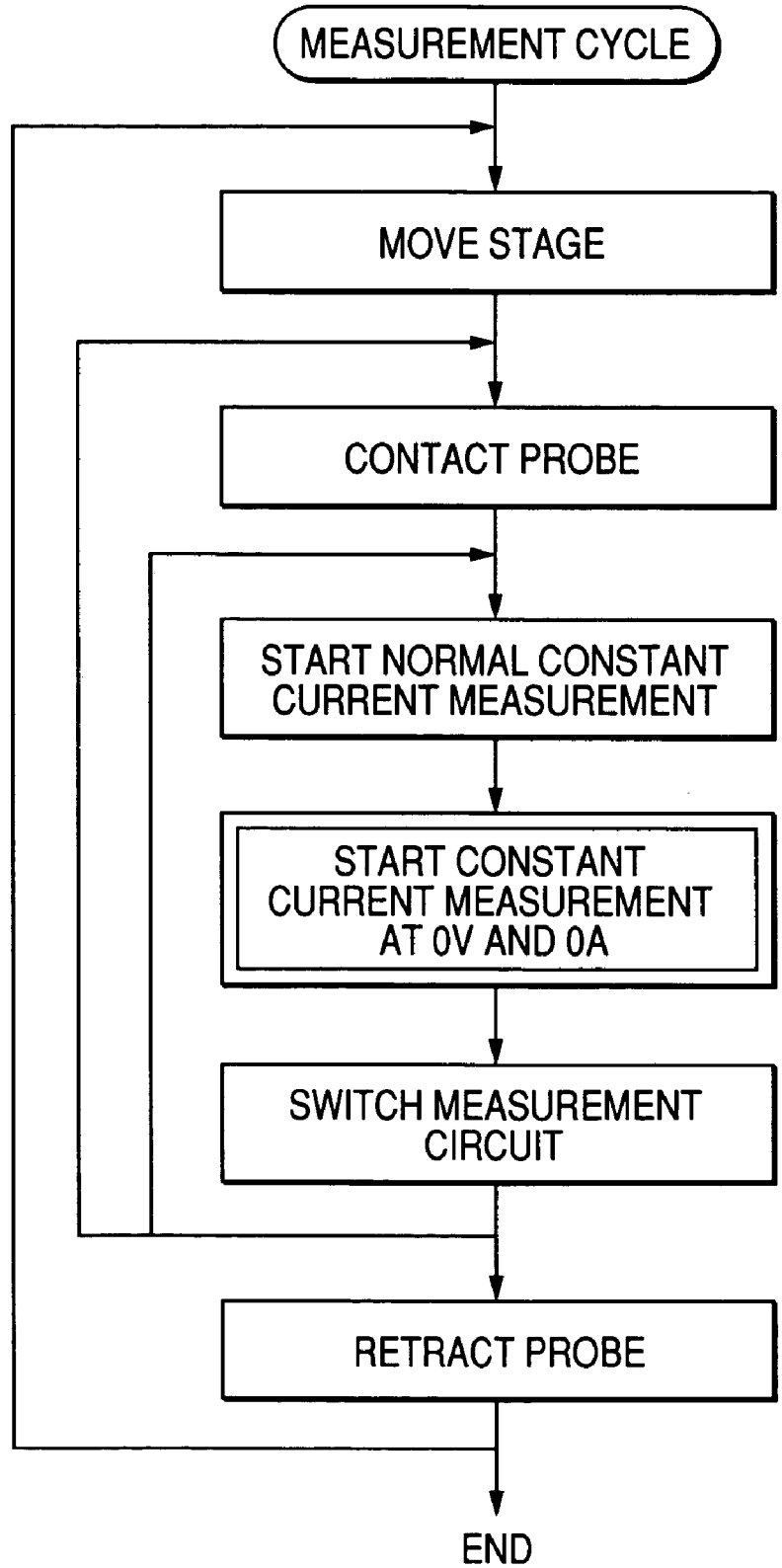
FIG. 2 is a flowchart that shows one example of a measurement flow in an embodiment.
Figure 4A:
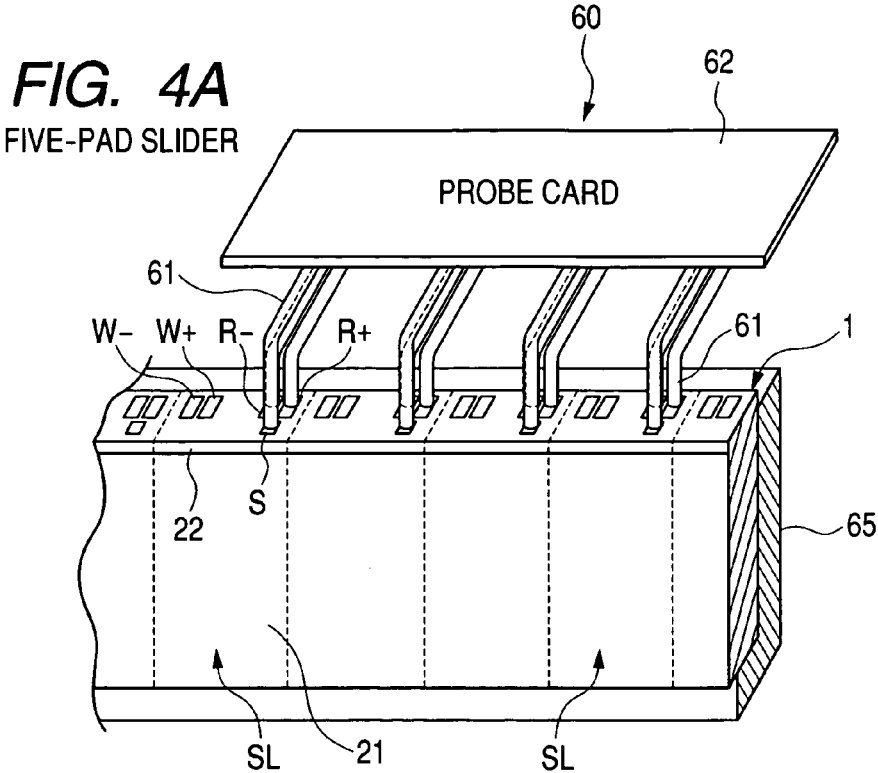
FIG. 4A is a perspective view for explaining measurement operation of a five-pad slider by using a probe card in an embodiment.
Figure 4B:
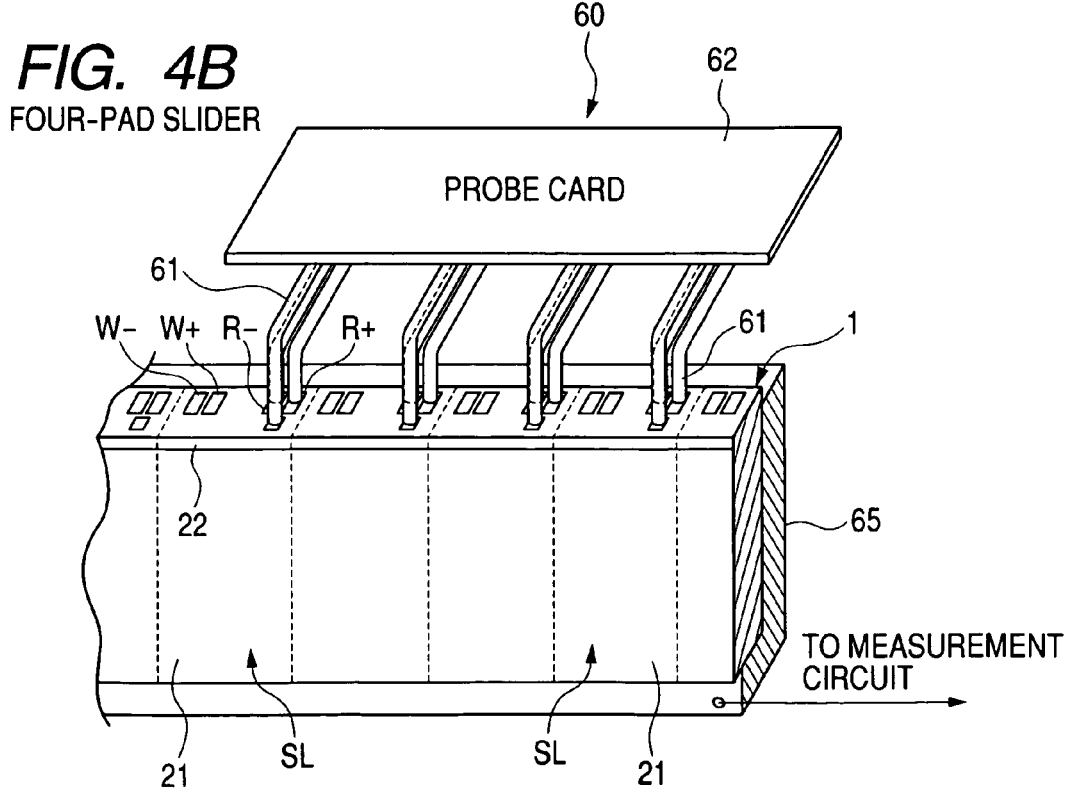
FIG. 4B is a perspective view for explaining measurement operation of a four-pad slider by using a probe card in an embodiment.

FIG. 1 is a schematic plan view of a detection device configuration that is an embodiment of the present invention, and FIG. 2 is a measurement flow diagram. FIG. 3 is a plan view that shows an arrangement of a slider bar with respect to a carrier. The term "slider bar" as used herein means one in a bar state before a slider is cut into individual pieces. FIGS. 4A and 4B are perspective views each showing an arrangement of a probe with respect to a slider pad, and FIGS. 5A to 5D are plan view diagrams each showing an arrangement of a probe with respect to a slider pad. FIG. 6 is a circuit diagram that shows a principle of resistance measurement for a five-pad slider, and FIGS. 7A and 7B are circuit diagrams of resistance measurement circuits.

In FIG. 1, a carrier 40 on which a plurality of slider bars 1 are disposed in parallel is positioned on a base 30. Further, a conveyor stage 50 that conveys one of the slider bars 1 as a measurement object is provided on the base 30, the conveyor stage 50 being capable of linear reciprocating motion. A positioning station ST1 and a measurement station ST2 are provided along the conveyor stage 50. The positioning station ST1 is provided with positioning pawls 51 that regulate the positions of the slider bars 1 with respect to the conveyor stage 50. Further, a probe card 60 having four probe groups is provided to the measurement station ST2, the probe card 60 being capable of contacting slider pads. Although omitted from the drawings, provided is a pick and place mechanism for transferring the slider bars 1 between the carrier 40 and the conveyor stage 50. Each of the probes is connected to a resistance measurement circuit discussed later with reference to FIGS. 7A and 7B.

As shown in Table 2 below, there are two shapes for the sliders that are taken as the measurement objects here, a 30% slider shape and a 20% slider shape.

TABLE 2

| Bar shape | Slider Dimensions (mm) | Pad shape |
|---|---|---|
| 30% slider | 1.0 × 0.3 × 1.2 | 2 type |
| 20% slider | 0.7 × 0.23 × 0.85 | 1 type |

As shown in FIG. 3, although the carrier 40 can store 30 of the slider bars 1, only 29 of the slider bars 1 are stored when using the carrier owing to the existence of the pick and place mechanism of the device. The external shape of the carrier 40 is common for all types of slider bars described herein. Further, the slider bars 1 are stored so that pads of the respective sliders SL face upward.

Two types of pad patterns, a five-pad pattern and a four-pad pattern, are used with the 30% slider. Only a five-pad pattern is used with the 20% slider, and its configuration is based on that of the 30% slider.

Figure 9A:
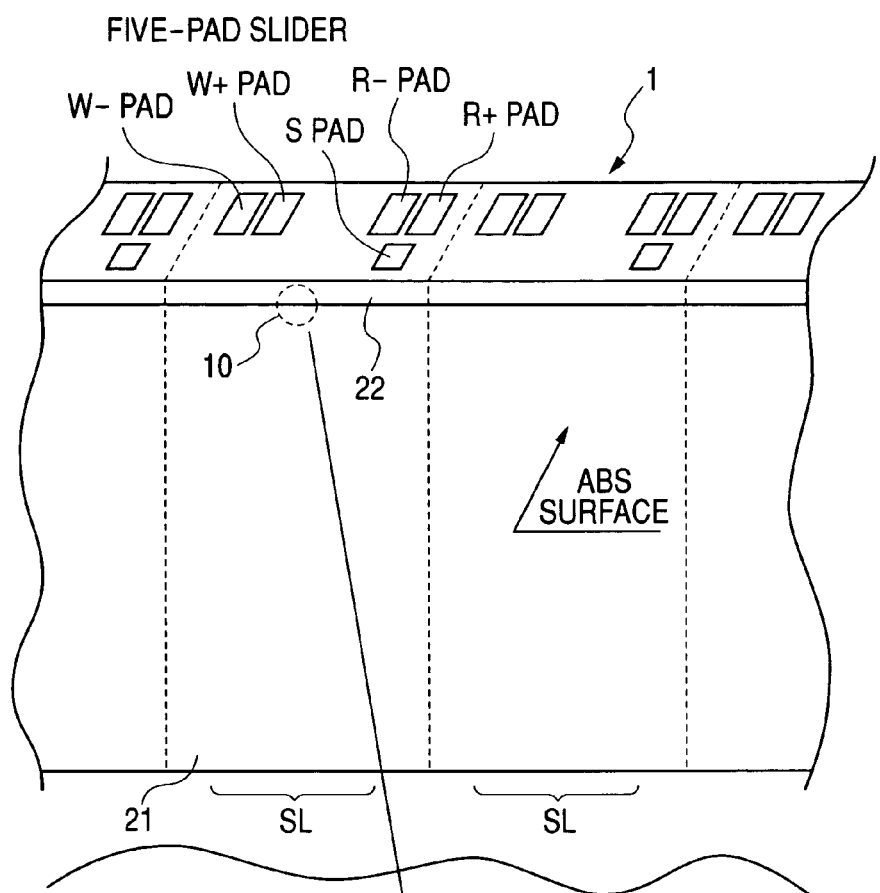
FIG. 9A is a schematic diagram of a conventional five-pad slider.
Figure 9B:
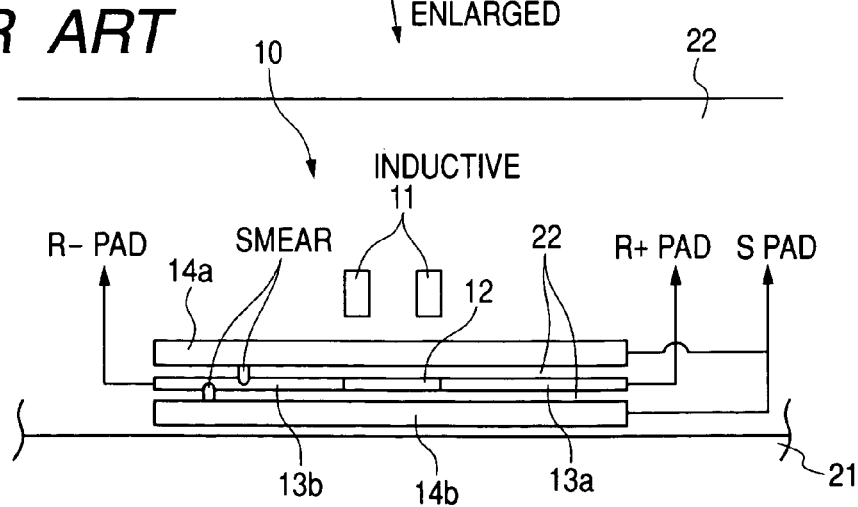
FIG. 9B is a schematic diagram of the conventional five-pad slider.

As explained with reference to FIGS. 9A and 9B, there are five types of pads, a W+ pad, a W− pad, an R+ pad, an R− pad, and an S pad, provided to the five-pad slider SL shown in FIG. 4A. Only three types of those, the R+ pad, the R− pad, and the S pad, are used in smear detection. One of the electrodes of the MR element 12 as a magnetic sensing element, the electrode 13a, is conductive with the R+ pad, and the other electrode of the MR element 12, the electrode 13b, is conductive with the R− pad. The shields 14a and 14b are conductive with the S pad. As shown in Table 1, the development of smear (shield portion wear) lowers the electrical resistance value between the S pad and the R+ pad or the R− pad to a value equal to or less than 1 kΩ. Reductions in the resistance values may therefore be measured and detected.

The four probe groups on the probe card 60 are attached to a substrate 62, disposed at the pitch that the sliders are disposed, so as to be capable of measuring four of the sliders SL at once (simultaneously). Three probes 61 of each of the probe groups are each set to freely contact one pad from among the R+ pad, the R− pad, and the S pad. It should be noted that, in principle, at least one probe group should be provided to the probe card so that at least one of the sliders SL can be measured.

Figure 10A:
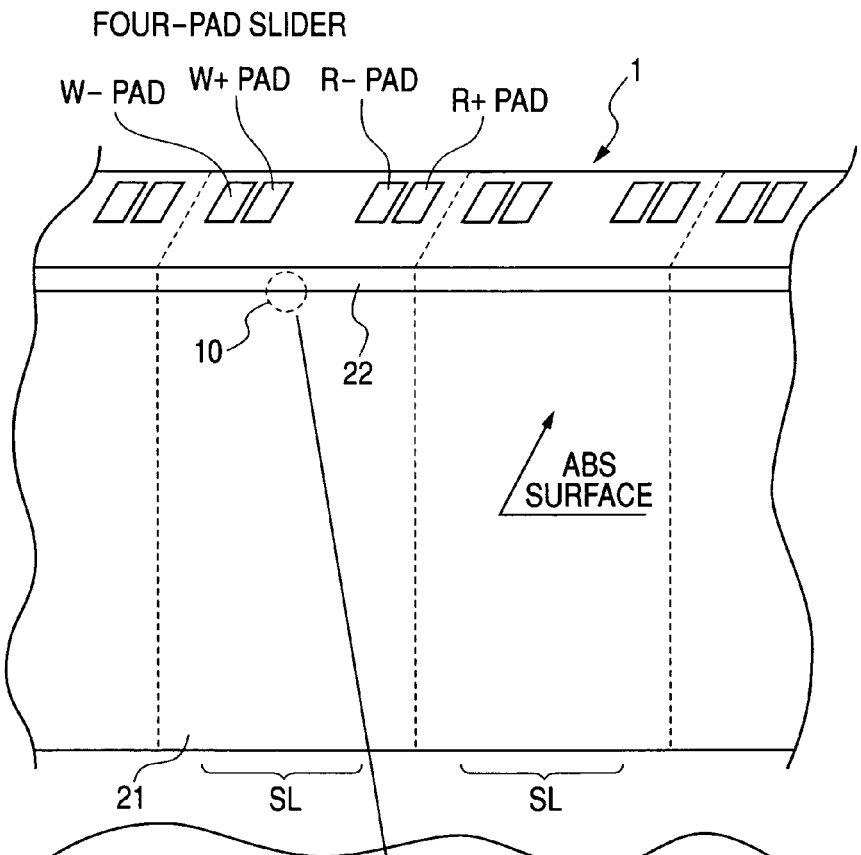
FIG. 10A is a schematic diagram of a conventional four-pad slider.
Figure 10B:
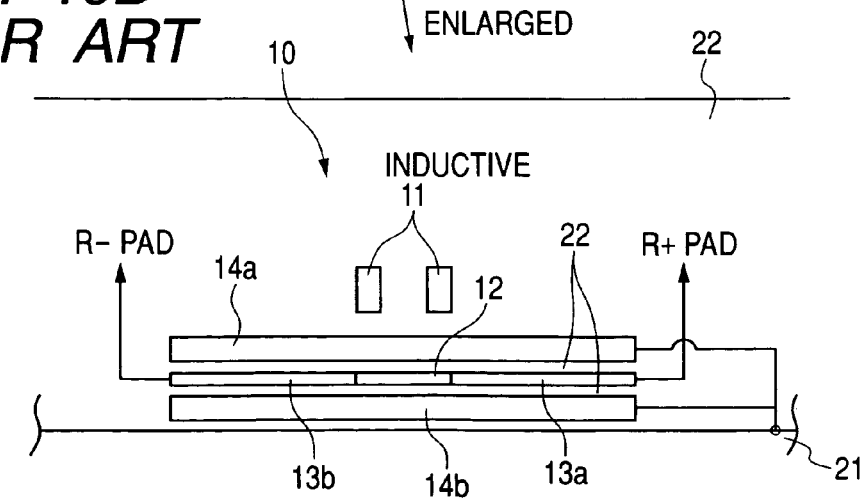
FIG. 10B is a schematic diagram of the conventional four-pad slider.

As explained with reference to FIGS. 10A and 10B, there are four types of pads, a W+ pad, a W− pad, an R+ pad, and an R− pad, provided to the four-pad slider SL shown in FIG. 4B. Two types of pads, the R+ pad and the R− pad, and the conductor portion 21 made of AlTiC or the like and connected to a shield are used in smear detection here. As shown in Table 1, the development of smear lowers the electrical resistance value between the conductor portion 21 and the R+ pad or the R− pad to a value equal to or less than 1 kΩ. Reductions in the resistance values may therefore be measured and detected. In this case the probe card 60 used in FIG. 4A is also used here. That is, out of the three probes 61 of each probe group, two contact the R+ pad and the R− pad while the other contacts a portion without a pad. The portion without a pad is electrically insulated, however, so problems do not develop. The S pad is not present when using the four-pad slider SL. As a substitute, the slider bar 1 is placed on a bar placement stand 65 that electrically contacts the conductor portion 21, and there is conductivity from the bar placement stand 65 to the conductor portion 21 for each of the sliders at once. It should be noted that the bar placement stand 65 is fixed on the conveyor stage 50 of FIG. 1, and contacts the conductor portion 21, functioning as an electrically conducting member. Identical portions in FIGS. 9A and 9B and FIGS. 10A and 10B have identical reference numerals attached, and an explanation of such structures is omitted.

It should be noted that the configuration of the probes used for the 30% slider differs from that of the probes used for the 20% slider because the sliders are different in size. The probe card cannot be used for both slider types.

Figure 5A:
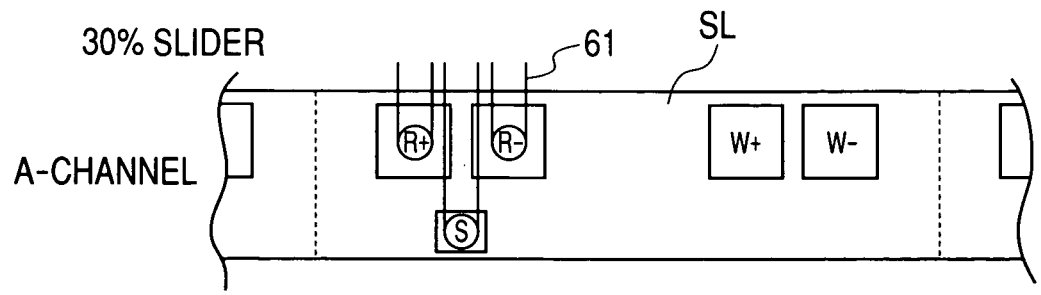
FIG. 5A shows an arrangement of an A-channel type probe of a 30% slider in an embodiment.
Figure 5B:
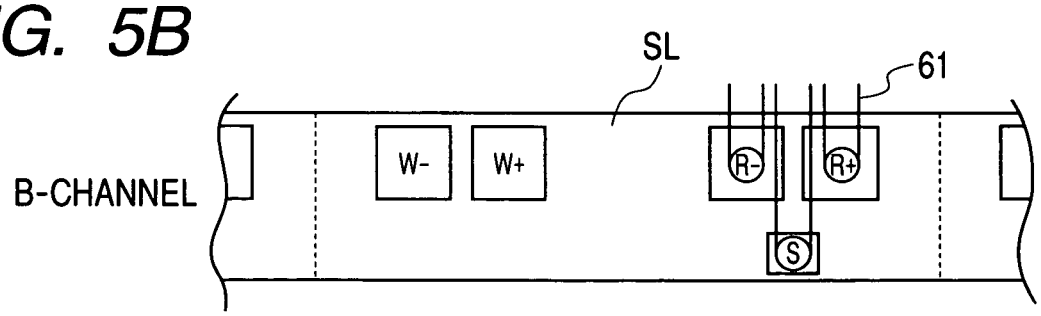
FIG. 5B shows an arrangement of a B-channel type probe of a 30% slider in an embodiment.
Figure 5C:
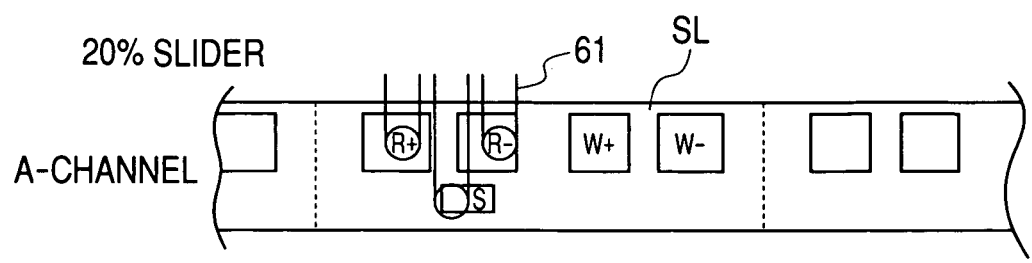
FIG. 5C shows an arrangement of an A-channel type probe of a 20% slider in an embodiment.
Figure 5D:
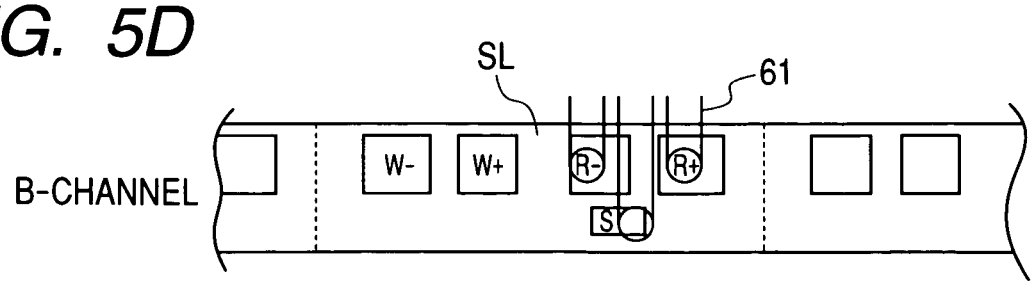
FIG. 5D shows an arrangement of a, B-channel type probe of a 20% slider in an embodiment.
Figure 6:
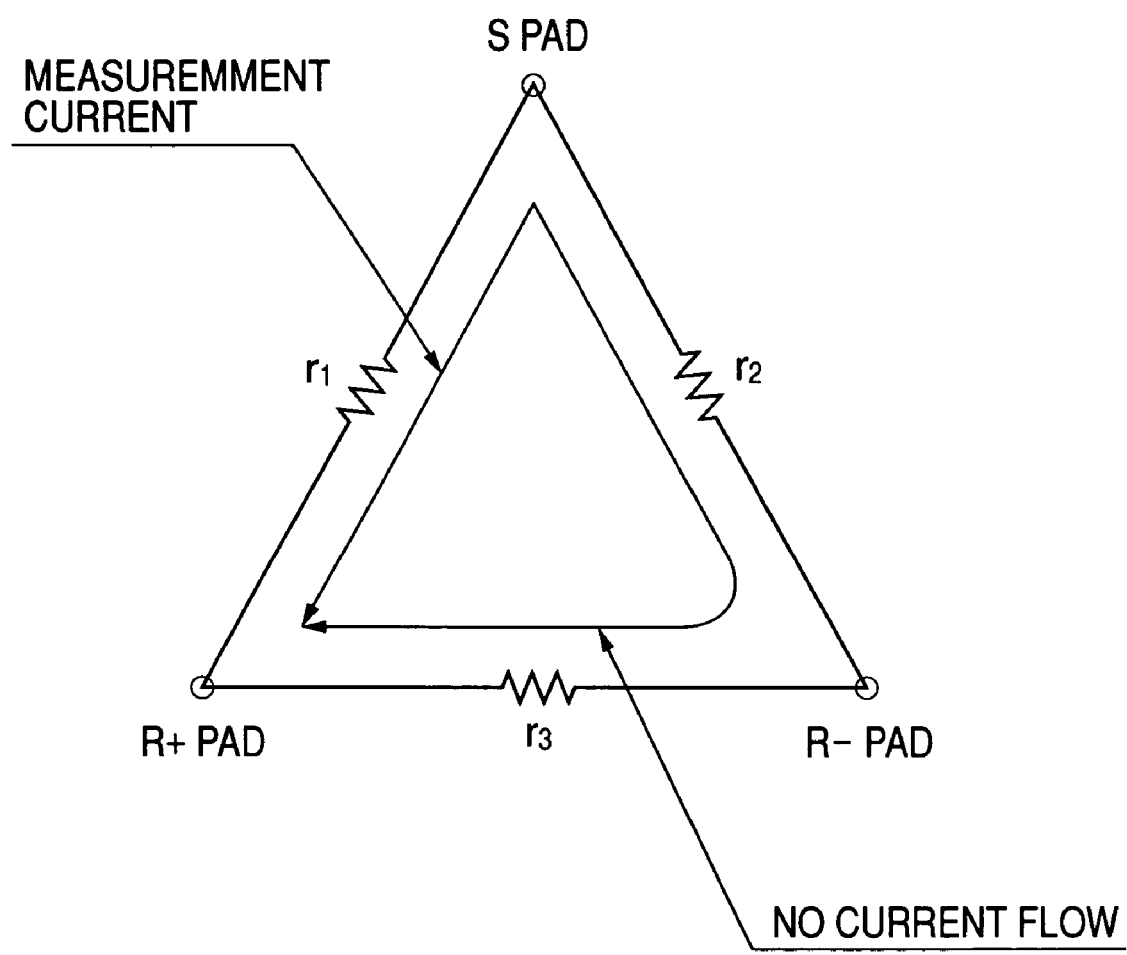
FIG. 6 is a circuit diagram that explains a principle of resistance measurement among an S pad, an R+ pad, and an R− pad in an embodiment.

As shown in FIGS. 5A to 5D, there are A-channel type and B-channel type sliders SL different from each other. FIG. 5A shows the A-channel type for the 30% slider, FIG. 5B shows the B-channel type for the 30% slider, FIG. 5C shows the A-channel type for the 20% slider, and FIG. 5D shows the B-channel type for the 20% slider.

For the 30% slider, a positional relationship among the R+ pad, the R− pad, and the S pad is the same for the A-channel type and the B-channel type. Accordingly, the probe can be commonly used for both types if the probe is aligned with the S pad. Further, for the 20% slider, a positional relationship among the R+ pad, the R− pad, and the S pad differs between the A-channel type and the B-channel type. In order to make the probes usable for both the A-channel type and the B-channel type, the probes are given a shape that can contact the R+ pad, the R− pad, and the S pad of both types of 20% sliders, and aligned with the positions of the pads.

Measurement operations of the slider bar 1 are explained with reference to FIG. 1.

The slider bars 1 that are the measurement objects are set by hand in the carrier 40 in advance. One of the slider bars 1 is delivered from the carrier 40 to the conveyor stage 50 by the pick and place mechanism. The conveyor stage 50 first moves to the positioning station ST1, and the slider bar 1 is positioned by the positioning pawls 51. The conveyor stage 50 then moves to the measurement station ST2.

At the measurement station ST2, the four probe groups (each group consists of three probes 61) provided to the probe card 60 are operated upward and downward, and resistance measurements of the four sliders SL are taken in one operation (all at once). The conveyor stage 50 then advances at a pitch amount equal to four slider portions, and resistance measurement is performed for all of the sliders of the one slider bar 1.

After the resistance measurement has been completed, the slider bar 1 is returned from the conveyor stage 50 to the carrier 40 by the pick and place mechanism.

Standardized values for the resistance values in the resistance measurement between the respective measurement points in the five-pad sliders and the four-pad sliders are listed in Table 1.

Resistance values between the R+ pad and the S pad, and between the R− pad and the S pad are used in smear detection for the five-pad slider, while resistance values between the R+ pad and the conductor portion 21, and between the R− pad and the conductor portion 21 are used in smear detection for the four-pad slider. When smear develops, the resistance values show values from several ohms to on the order of 1 kΩ depending on the degree of smear. Accordingly, smear is judged to have developed when any of those resistance values is less than a threshold value of 1 kΩ (or a threshold value that is less than 1 kΩ). Further, the resistance between the R+ pad and the R− pad displays a fixed value. A slider failure or a probe contact failure may be considered when the resistance between the R+ pad and the R− pad displays an irregular value. There is a possibility that contact with the probes is imperfect if the irregularity continues to be generated, and this irregularity serves as a barometer for inspecting the detection device.

As can be seen from Table 1, the difference in resistance value is large between the presence and the absence of smear for the five-pad slider. With the four-pad slider, however, the difference in resistance value is small between the presence and the absence of smear (as shown in Table 1, 1.25 kΩ when smear is not present, and 1 kΩ when smear is present). It is therefore necessary to measurement the resistance between the pads with high accuracy. Accordingly, for cases like that of FIG. 6 where the resistances among the R+ pad, the R− pad, and the S pad are measured for one slider, for example when measuring a resistance r1 between the S pad and the R+ pad, the value of the resistance r1 is found by applying a voltage between the S pad and the R+ pad and measuring the amount of current flowing through the resistance r1. A correct resistance value cannot be found if the electric current also flows through resistances r2 and r3 at this point. The electric potential difference between the S pad and the R− pad, and the electric potential difference between the R− pad and the R+ pad are controlled to zero.

As can be understood from FIG. 6, network resistance measurement is to be made for a measurement object. With four-point measurement of r1, the measurement of r1 becomes the combined resistance of r2 and r3, and a correct value cannot be obtained. The term "four-point measurement" as used here means a measurement method in which probes make contact at two points, the S pad and the R+ pad, and each probe is connected to two wires of a source and a voltmeter. By also contacting a probe to the R− pad of FIG. 6, that is, by using six-point measurement in which the source and the two voltmeter wires are connected to each probe, no current flows through the resistances r2 and r3 and the electric potential differences there can be made approximately zero. The value of the resistance r1 can thus be found accurately. With the six-point measurement, the electric potential differences can be made approximately zero by connecting the two wires of the source and the voltmeter to each probe.

FIGS. 7A and 7B each show a configuration of a specific resistance measurement circuit for six-point measurement (the two wires of the source and the voltmeter are connected to the probes at three locations, and therefore this is referred to as six-point measurement). A predetermined direct current voltage of 10 mV is applied to a measurement object resistance R1 by a voltage source, and electric potential differences between a contact point of a first non-measurement resistance R2 and a second non-measurement resistance R3, and one terminal of the measurement object resistance R1 is maintained at a very small value (150 μV) by using a high amplitude op-amp OP1.

Taking an electric power source voltage as VS, an electric power source current as IM, the current flowing in the resistance R1 as I1, and the current flowing in the resistance R2 as IERR:

$$IM = I1 + IERR,$$

$$IERR = 150 \ \mu V/R2, \text{ and}$$

$$I1 = VS/R1,$$

and the measured value is found by the following equation:

$$RM = VS/IM = R1/[\{1 + (150 \ \mu V/VS) \times (R1/R2)\}] \quad (\text{Eq. 1})$$

The term $(150 \ \mu V/VS) \times (R1/R2)$ shows an error here. The error becomes large in Eq. 1 if R1>>R2. If R2 is taken as an MR element (50 Ω), it can be understood that the measurement error of R1 becomes large.

As described above, while the resistance of the MR element (between the R+ pad and the R− pad) is about 50 Ω, the order of the resistance value to be measured varies from $10^1$ to $10^3$ to infinite for smear detection, as shown in Table 1. In this case a large scale error in the measurement value also appears in the six-point measurement of FIG. 7A, and depending upon the circumstances, there is a possibility that a threshold value (equal to or less than 1 kΩ in view of Table 1) cannot be established.

The measurement error can be reduced for cases of this type by inversing the polarity of the electric power source voltage VS with respect to the resistance R1. That is:

$$IM = I1 + IERR,$$

$$IERR = 150 \ \mu V/R3, \text{ and}$$

$$I1 = VS/R1,$$

and the measured value is found by the following equation:

$$RM = VS/IM = R1/[\{1 + (150 \ \mu V/VS) \times (R1/R3)\}] \quad (\text{Eq. 2})$$

$$150 \ \mu V/VS = (0.15/10) \times 10^{-3} = 1.5 \times 10^{-5}$$

At this point R1≈R3, and the error becomes small. The measurement accuracy of the circuits of FIGS. 7A and 7B can thus be increased by switching the polarity of the direct current voltage value of the voltage source so that the current IERR flowing outside of the measurement object resistance becomes small.

It should be noted that, although the measurement object resistance is R1 in the state shown in FIGS. 7A and 7B, R2 and R3 also may also become measurement object resistances in turn by scanning.

Error computation results for cases of four-terminal measurement and six-terminal measurement are shown in FIGS. 8A to 8F. With examples of four-terminal measurement of FIGS. 8A and 8B, a measurement error is on the order of 50%. Further, with examples of six-terminal measurement of FIGS. 8C and 8D (only the circuit of FIG. 7A is used), the error increases when R2 is equivalent to 50 Ω. The application direction of the electric power source voltage (Hi/Lo) is then switched as shown in FIG. 7B. That is, when R2 in FIGS. 8A to 8F becomes the resistance of the MR element (about 50 Ω) (scan2) during measurement scanning, probe polarities Input Hi and Input Lo of the resistance R1 to be measured are switched, and IERR (the current flowing between Hi and Guard) is prevented from becoming large. It thus becomes possible to reduce the measurement error to the 1% level as shown in FIGS. 8E and 8F.

It should be noted that the slider is electrically fragile, and therefore the voltages and the currents used in measurement are kept low. It is preferable that measurement be made with voltages on the order of 1 to 10 mV, and currents on the order of 1 to 10 µA.

During six-terminal measurement in FIGS. 7A and 7B, a current is made to flow after probe contact, and the probe is released (separated form the pads) after the current is cut off in order to prevent an excess current during probe contact and release. If there is an electric potential difference with the measurement probe at times except measurement, such as during contact and release of the measurement probe, the difference may cause ESD damage (damage caused by static electricity, residual charge, or the like). Measurement operations are therefore performed by: setting zero volts and zero amps after normal measurement; setting the electric potential of the measurement probe to zero; and then moving to the next measurement operation. A measurement flow that takes this point into consideration is shown in FIG. 2.

For sliders having the same external shape (30% sliders or 20% sliders) per carrier, even if the slider bar size (L, M, S) and direction (A-channel, B-channel) are different, switching becomes possible by setting (storing) coordinate data in advance for the pad positions of each slider of the slider bars with respect to a reference point such as the conveyor stage 50 or the bar placement stand 65 of the detection device of FIG. 1, and by selecting the coordinate data that corresponds to the size and direction of the slider bar during measurement.

The measured resistance values are displayed on a monitor, and a data file having a CSV or other format is created for each carrier, and stored. The file records a carrier identification symbol, slider bar numbers, measured resistance values and results (presence or absence of smear, whether the head main body portion is good or bad) for each slider, and the like.

Slider selection is performed by other process steps based on the file data, and sliders that have been judged to have smear, as well as sliders that have been judged to have head main body failures, are removed as defective parts.

It should be noted that there are four probe groups in the probe card as shown in FIGS. 4A and 4B, and normally four sliders are measured simultaneously. Even if a portion of the probes become unusable for some reason or another, measurement is still possible by using the remaining probe groups.

The effects shown below can be obtained according to this embodiment.

(1) The development of smear can be detected by measuring the electrical resistance values between the pads (or the conductor portion), connected to the shield or the MR element as a magnetic sensor element, with the sliders SL having the integrated head main body portion 10, in a bar state (slider bar state). Thus, there is no need to use sliders having smear failures therefore in the subsequent processes. Accordingly, it is possible to increase the manufacturing yield in processes for manufacturing HDD thin film magnetic heads.

(2) The degree of smear can be determined by the resistance values, and therefore a prior rubbing process (process for polishing the ABS surface of the slider bars) can be monitored.

(3) Smear detection is performed at the slider bar stage before sliders are cut into individual pieces. Handling is therefore easier than the state where the sliders are already cut into individual pieces, and work for taking the measurement can be performed efficiently.

(4) By devising a suitable arrangement of the probes 61 that are attached to the probe card 60, measurement is possible by using the same probe card, whether there are four pads of electrodes or five pads of electrodes, for cases where the sliders have the same shrinkage (20% or 30%). Specifically, three probes that contact the pads of the slider SL are used as one group when performing electrical resistance value measurement. Further, the arrangement of the three probes is set as described hereinafter. That is, for sliders having five pads, three of the probes make contact with three of the five pads (those pads connected to the MR element electrodes and to the shield). For sliders having four pads, two of the probes make contact with two of the four pads (those pads connected to the MR element electrodes).

(5) The tact time can be shortened by using a probe card having a plurality of probe groups that can freely contact the pads on the slider SL.

(6) Coordinate data is stored for the pads on each of the sliders SL in the slider bar 1 with respect to a reference point (for example, the reference point on the conveyor stage of the detection device of FIG. 1, or the reference point of the bar placement stand 65 of FIGS. 4A and 4B that is fixed to the conveyor stage). For sliders having the same shrinkage (20% or 30%), measurement by reading the coordinate data set in advance can be performed by measurement operations in which the probes make contact with the pads based on the coordinate data, even if the bar size (S, M, L) or the channel direction differs, by utilizing the reference point.

(7) The generation of errors can be suppressed by inverting the direction of the electric potential difference (inverting the polarity of the voltage applied so that the current IERR that flows in the resistances not measured becomes small) in the measurement probe for the measurement object resistance in the measurement circuit of FIGS. 7A and 7B that detects smear. The errors are caused by differences in network resistance values, and correspond to combining the measurement object resistance with resistances that are not to be measured in the scanning process.

(8) After completing electrical resistance measurements on the slider SL, each of the probes is given a zero electric potential and a zero current before being removed from the pads. Each of the probes 61 is also placed in a zero electric potential, zero current state before being placed in contact with the pads. ESD damage (damage caused by static electricity, residual charge, or the like) can thus be prevented.

It should be noted that, although there are four probe groups provided to the probe card in the embodiment described above, another number of probe groups may also be used. As the number of probe groups becomes higher, the number of sliders that can be measured at one time increases, and the device tact time becomes shorter. However, the cost of the probe card and the measurement equipment becomes higher, and further, maintenance become more difficult.

Furthermore, it is preferable that the configuration of the probes be commonly usable by as many slider types as possible. However, if common use of the probes is not taken into account, the configuration of the probes can also correspond to all types of pad patterns.

The embodiment of the present invention is explained above, but the present invention is not limited thereto. Various changes and variations that are possible within the scope of the claims should be self-evident to one skilled in the art.

The effects described below can be achieved according to the method of, and device for, detecting smear of a magnetic head according to the present invention as explained above.

The development of smear can be detected, and it is possible to detect whether or not smear has developed before magnetic head assembly, by measuring the electrical resistance values between the pads on the slider having the integrated head main body portion, or the electrical resistance values between the pads and the conductor portion that is connected to the shield of the head main body portion.

Furthermore, there is no need to use sliders that have failed due to smear are not used in the subsequent processes, and this can contribute to an increase in yield in the manufacturing processes for the magnetic heads.

Further, handling is easier, and measurement and inspection can be implemented more efficiently, for cases where measurement is performed at the slider bar stage, in which the sliders are connected in a bar shape, compared to a state where the individual sliders are cut from the slider bar.

In addition, the degree of smear can be determined by the resistance values, and therefore the prior rubbing process can be monitored.

The embodiment of the present invention is explained above, but the present invention is not limited thereto. Various changes and variations that are possible within the scope of the claims should be self-evident to one skilled in the art.

What is claimed is:

1. A method of detecting smear of a magnetic head, comprising measuring electrical resistance values between pads of a slider having an integrated head main body portion, or between the pads and a conductor portion that is connected to a shield of the head main body portion to thereby detect smear development, the measuring being performed by a probe card having a plurality of probes that contact the pads, wherein the plurality of probes are controlled to have a zero electric potential and a zero current when the plurality of probes contact the pads, and when the plurality of probes are removed from the pads.

2. A method of detecting smear of a magnetic head according to claim 1, wherein the measuring of the electrical resistance values is performed in a slider bar state where a plurality of the sliders are connected.

3. A method of detecting smear of a magnetic head according to claim 2, wherein the measuring of the resistance values is performed at one time on one slider, or a plurality of sliders, in the slider bar by using the probe card, the probe card having one group, or a plurality of groups, of the plurality of probes that contact the pads.

4. A method of detecting smear of a magnetic head according to claim 2, wherein the measuring of the electrical resistance values is performed by using three of the plurality of probes that contact the pads as one group, in which an arrangement of the three probes is set so that, for a slider having five pads, the three probes contact three pads from among the five pads, and for a slider having four pads, two of the three probes contact two pads from among the four pads, and in which the probe arrangement is commonly used for the slider having five pads and for the slider having four pads.

5. A method of detecting smear of a magnetic head according to claim 2, wherein:
coordinate data for positions of each of the slider pads in the slider bar is stored with respect to a reference point; and
the plurality of probes are made to contact the pads based on the coordinate data.

6. A method of detecting smear of a magnetic head according to claim 1, wherein for cases where the measuring of the electrical resistance values is performed at three points between pads that are connected to electrodes at both ends of a magnetic sensing element in the head main body portion and a pad that is connected to a shield, or between the pads that are connected to the electrodes and a conductor portion, a predetermined direct current voltage is applied to a measurement object resistance (R1) by a voltage source, an electric potential difference between one terminal of the measurement object resistance (R1) and a connection point of a first non-measurement resistance (R2) and a second non-measurement resistance (R3) is maintained at a very low value, and the polarity of the direct current voltage of the voltage source is switched so that a current (IERR) flowing outside the measurement object resistance (R1) becomes small.

7. A device for detecting smear of a magnetic head, comprising:
a stage on which a slider bar having a plurality of sliders with integrated head main body portions is placed;
positioning means for determining positions of the slider bars;
a resistance measurement circuit for measuring electrical resistance values between pads of the slider, or between the pads and a conductor portion that is connected to a shield of the head main body portion, and
a probe card having a plurality of probes that contact the pads, wherein the plurality of probes are controlled to have a zero electric potential and a zero current when the plurality of probes contact the pads, and when the plurality of probes are removed from the pads.

8. A device that detects smear of a magnetic head according to claim 7, the probe card having a plurality of probe groups that contact the pads, wherein measurement of the electrical resistance values is performed at one time on a plurality of sliders in the slider bar.

9. A device that detects smear of a magnetic head according to claim 8, wherein the probe groups are configured to each have three probes, and the three probes are arranged so that, for a slider having five pads, the three probes contact three pads from among the five pads, and for a slider having four pads, two of the three probes contact two of the four pads.

10. A device that detects smear of a magnetic head according to claim 7, wherein the stage has an electrically conductive member that contacts the conductor portion that is connected to the shield of the slider bar.

* * * * *